United States Patent
Parsey, Jr. et al.

(10) Patent No.: US 7,799,640 B2
(45) Date of Patent: Sep. 21, 2010

(54) METHOD OF FORMING A SEMICONDUCTOR DEVICE HAVING TRENCH CHARGE COMPENSATION REGIONS

(75) Inventors: John M. Parsey, Jr., Phoenix, AZ (US);
Gordon M. Grivna, Mesa, AZ (US);
Shanghui L. Tu, Phoenix, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 769 days.

(21) Appl. No.: 11/536,249

(22) Filed: Sep. 28, 2006

(65) Prior Publication Data

US 2008/0081440 A1    Apr. 3, 2008

(51) Int. Cl.
*H01L 21/336* (2006.01)
(52) U.S. Cl. ............... 438/268; 438/269; 257/E29.151
(58) Field of Classification Search ............... 438/268, 438/269
See application file for complete search history.

(56) References Cited

U.S. PATENT DOCUMENTS

| | | |
|---|---|---|
| 5,216,275 A | 6/1993 | Chen |
| 5,438,215 A | 8/1995 | Tihanyi |
| 5,571,738 A | 11/1996 | Krivokapic |
| 5,872,421 A | 2/1999 | Potter |
| 5,998,288 A | 12/1999 | Gardner et al. |
| 6,184,555 B1 | 2/2001 | Tihanyi et al. |
| 6,191,446 B1 | 2/2001 | Gardner et al. |
| 6,210,999 B1 | 4/2001 | Gardner et al. |
| 6,255,152 B1 | 7/2001 | Chen |
| 6,274,904 B1 | 8/2001 | Tihanyi |
| 6,278,165 B1 | 8/2001 | Oowaki et al. |
| 6,355,955 B1 | 3/2002 | Gardner et al. |
| 6,410,955 B1 | 6/2002 | Baker et al. |
| 6,479,352 B2 | 11/2002 | Blanchard |
| 6,509,240 B2 | 1/2003 | Ren et al. |
| 6,512,267 B2 | 1/2003 | Kinzer et al. |
| 6,576,516 B1 | 6/2003 | Blanchard |
| 6,608,350 B2 | 8/2003 | Kinzer et al. |
| 6,693,338 B2 | 2/2004 | Saitoh et al. |
| 6,919,610 B2* | 7/2005 | Saitoh et al. ............... 257/492 |
| 2004/0142542 A1* | 7/2004 | Murphy et al. ............. 438/479 |
| 2004/0206980 A1 | 10/2004 | Cheong et al. |
| 2006/0180947 A1 | 8/2006 | Loechelt et al. |
| 2007/0009840 A1* | 1/2007 | Kim et al. .................. 430/313 |
| 2007/0108512 A1* | 5/2007 | Sedlmaier et al. .......... 257/328 |

OTHER PUBLICATIONS

Mizushima et al., "Empty-space-in-silicon technique for fabricating a silicon-on-nothing structure", Applied Physics Letters, vol. 77, No. 20, Nov. 13, 2000, pp. 3290-3292.

Shenoy et al. "Analysis of the Effect of Charge Imbalance on the Static and Dynamic Characteristics of the Super Junction MOSFET", IEEE Power Semiconductor Devices and ICs, 1999. ISPSD '99. Proceedings., The 11th International Symposium 1999, 0-7083-5290-4/99, pp. 99-102.

(Continued)

*Primary Examiner*—Alexander G Ghyka
(74) *Attorney, Agent, or Firm*—Kevin B. Jackson

(57) ABSTRACT

In one embodiment, a method of forming a semiconductor device with trench charge compensation structures includes exposing the trench sidewalls to a reduced temperature hydrogen desorption process to enhance the formation of monocrystalline semiconductor layers.

21 Claims, 9 Drawing Sheets

OTHER PUBLICATIONS

James, "Infineon uses vertical structure to optimize on-resistance in power MOS devices", MICRO Magazine, Apr. 2006.

Rub et al., "A Novel Trench Concept for the Fabrication of Compensation Devices" Power Semiconductor Devices and ICs, 2003. Proceedings. ISPSD '03. 2003 IEEE 15th International Symposium, Apr. 14-17, 2003, pp. 203-206.

The Patent Office of the People's Republic of China, Office action for China patent application No. 200710148934.X dated Jan. 29, 2010.

* cited by examiner

METHOD OF FORMING A SEMICONDUCTOR DEVICE HAVING TRENCH CHARGE COMPENSATION REGIONS

FIELD OF THE INVENTION

This invention relates generally to semiconductor devices, and more specifically to power switching devices and methods of their manufacture.

BACKGROUND OF THE INVENTION

Metal-oxide semiconductor field effect transistors (MOSFETs) are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

Today's high voltage power switch market is driven by two major parameters: breakdown voltage (BVdss) and on-state resistance (Rdson). For a specific application, a minimum breakdown voltage is required, and in practice, designers typically can meet a BVdss specification. However, this is often at the expense of Rdson. This trade-off in performance is a major design challenge for manufacturers and users of high voltage power switching devices.

Recently, superjunction devices have gained in popularity to improve the trade-off between Rdson and BVdss. In a conventional n-channel superjunction device, multiple heavily-doped diffused n-type and p-type regions replace one lightly doped n-type epitaxial region. In the on state, current flows through the heavily doped n-type regions, which lowers Rdson. In the off or blocking state, the heavily doped n-type and p-type regions deplete into or compensate each other to provide a high BVdss. Although superjunction devices look promising, significant challenges still exist in manufacturing them.

Accordingly, high voltage power switching device structures and methods of manufacture are needed that provide lower Rdson and high BVdss.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor.

Although the devices are explained herein as certain N-channel or P-channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

In addition, the device of the present invention may embody either a cellular design (where the body regions are a plurality of cellular regions) or a single body design (where the body region is compromised of a single region formed in an elongated pattern, typically in a serpentine pattern). However, the device of the present invention will be described as a cellular design throughout the description for ease of understanding. It should be understood that it is intended that the present invention encompass both a cellular design and a single body or base design.

DETAILED DESCRIPTION OF A PREFERRED EMBODIMENT

Figure 1:
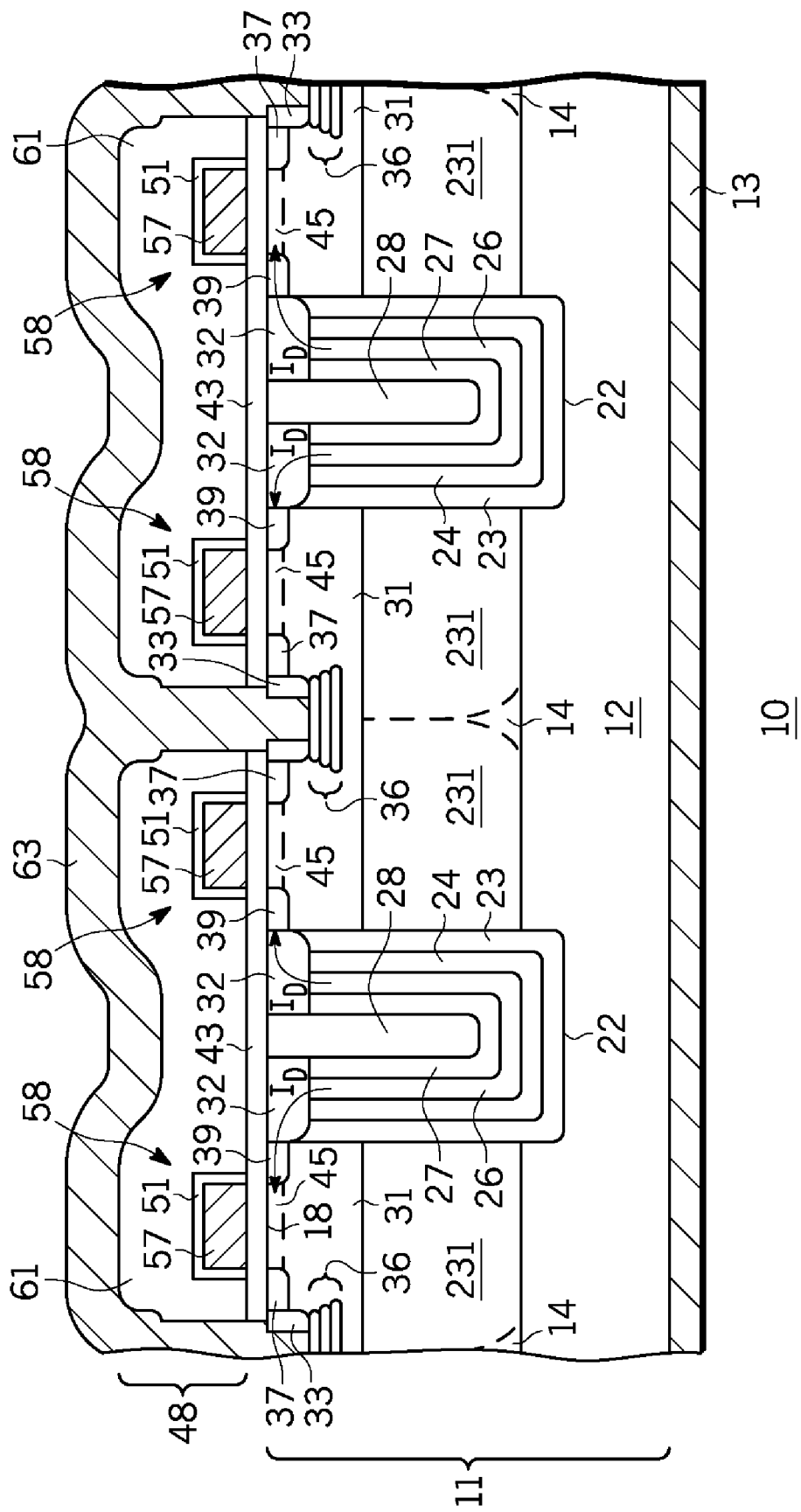
FIG. 1 illustrates an enlarged partial cross-sectional view of a semiconductor device in accordance with the present invention.

FIG. 1 shows a partial cross-sectional view of an insulated gate field effect transistor (IGFET), MOSFET, superjunction device, or switching device or cell 10 in accordance with an embodiment of the present invention. By way of example, device 10 is among many such devices integrated with logic and/or other components into a semiconductor chip as part of a power integrated circuit. Alternatively, device 10 is among many such devices integrated together to form a discrete transistor device.

Device 10 includes a region or body of semiconductor material 11, which comprises for example, an n-type silicon substrate 12 having a resistivity in range of approximately 0.001 to about 0.005 ohm-cm, and may be doped with arsenic or other n-type dopant. In the embodiment shown, substrate 12 provides a drain region for device 10, which is coupled to conductive layer 13. A semiconductor layer 14 is formed in or on substrate 12, and in accordance with the present invention is n-type or p-type and doped light enough so as to not impact charge balance in the trench compensation regions described below. In one embodiment, layer 14 is formed using conventional epitaxial growth techniques. In an embodiment suitable for a 600 volt device, layer 14 is doped n-type or p-type with a dopant concentration of about $1.0 \times 10^{13}$ atoms/cm$^3$ to about $1.0 \times 10^{14}$ atoms/cm$^3$, and has a thickness on the order of about 40 microns to about 60 microns. The thickness of layer 14 is increased or decreased depending on the desired BVdss rating of device 10. In an alternative embodiment, semiconductor layer 14 comprises a graded dopant profile with semiconductor layer 14 have a higher dopant concentration in proximity to substrate 12, and transitioning either gradually or abruptly to a lower concentration for the balance of its thickness. Other materials may be used for body of semiconductor material 11 or portions thereof including silicon-germanium, silicon-germanium-carbon, carbon doped silicon, III-V materials, or the like.

Device 10 further includes spaced apart filled or partially filled trenches, trenches containing layers of semiconductor material, epitaxial filled regions or trenches, charge compensating trench regions, deep trench charge compensation regions, charge compensating trench structures or charge compensation regions 22. Charge compensating trenches 22 include or contain a plurality of layers or multiple layers of semiconductor material, including layers of opposite conductivity type, which are separated by an intrinsic or buffer semiconductor layer or layers. The intrinsic layer functions, among other things, to prevent or reduce intermixing of the opposite conductivity type layer (i.e., the two charge layers), which is believed to negatively impact the conduction efficiency of device 10 in the on state. As used herein, charge compensation generally means that the total charge of the opposite conductivity type layers is substantially balanced or equal.

In one embodiment, filled trenches 22 include multiple layers or stacked layers of semiconductor material formed using single crystal or monocrystalline (i.e., not polycrystalline) epitaxial growth techniques. For example, compensation trench structures 22 include a p-type layer 23 formed on, overlying, or adjoining the trench walls or surfaces adjacent to body of semiconductor material 11. An intrinsic semiconductor or buffer layer 24 is formed on, overlying, or adjoining p-type layer 23. In one embodiment, which will be further explained below, intrinsic layer 24 comprises two or more separate layers formed at separate times in the fabrication of device 10. An n-type layer 26 is formed on, overlying, or adjoining intrinsic semiconductor layer 24, and an intrinsic semiconductor or buffer layer 27 is formed on, overlying, or adjoining n-type layer 26. Intrinsic layer(s) 24 functions, among other things, to prevent or reduce the mixing of dopants from layers 23 and 26, which helps control charge balancing and charge separation. This helps in turn to improve the conduction efficiency of device 10. Intrinsic layer 27 functions, among other things, to fill, seal or partially fill the trench.

For an n-channel device and in accordance with the present invention, n-type layers 26 provide a primary vertical low resistance current path from the channel to the drain when device 10 is in an on state. When device 10 is an off state, p-type layers 23 and n-type layers 26 compensate each other in accordance with the present invention to provide an increased BVdss characteristic. It is understood that additional n-type and p-type layers may be used, and preferably separated by additional intrinsic or buffer layers. In an alternative embodiment and as shown in FIG. 1, a dielectric layer 28 is formed overlying the outermost (e.g., layer 26 or 27). In one embodiment, dielectric layer 28 fills any remaining space within trench 22. In another embodiment dielectric layer 28 only partially fills any remaining space within trench 22 leaving, for example an air gap or void. By way of example, dielectric layer 28 comprises an oxide or a nitride or combinations thereof. In another embodiment, dielectric layer 28 comprises a thin thermal oxide capped with a thin polysilicon layer followed by a deposited TEOS layer. It was observed that in some applications, the thin oxide capped with polysilicon reduces shear stress from the deposited oxide thereby improving device performance. It is further understood that during thermal processing, n-type and p-type dopants from layers 26 and 23 diffuse into the buffer layers, and that distinct buffer layers may or may not be present in the final device. However, when deposited or formed, buffer layers 24 and/or 27 have a lower dopant concentration than layers 23 and 26. By way of example, buffer layers 24 and/or 27 have a dopant concentration that is about 10 to 100 times or more less than the dopant concentration of layers 23 and 26.

By way of example, p-type layers 23 and n-type layers 26 each have a dopant concentration on the order of about $9.0\times10^{16}$ to about $3.0\times10^{15}$ atoms/cm$^3$, and each have a thickness of about 0.1 microns to about 0.3 microns respectively. In one embodiment, intrinsic semiconductor or buffer layers 24 and 27 are undoped or very lightly doped p-type with a dopant concentration of less than about $1.0\times10^{14}$ atoms/cm$^3$, and each has a thickness of about 0.1 microns to about 1.0 microns.

Dopant from p-type layer 23 is diffused into semiconductor layer 14 to form p-type regions or laterally doped or diffused regions 231 (represented as dashed lines). P-type regions 231 laterally diffusing from adjacent trenches 22 may either completely merge together, or may not completely merge as shown in FIG. 1 so that a portion of semiconductor 14 is still present in the finished device. That is, the actual diffusion distance between adjacent laterally diffused region 231 is variable.

In one embodiment, diffused regions 231 comprise the opposite conductivity type to that of semiconductor layer 14. This embodiment provides for a unique structure where both the active device structure and edge termination structures (not shown) are formed in the same layer (i.e., layer 14), but the active device (i.e., device 10) is in a p-type layer because of laterally diffused regions 231, and the edge termination structures are formed in n-type layer 14 laterally separated from trenches 22.

Although not shown, it is understood that during the formation of device 10, n-type dopant from highly doped substrate 12 diffuses into the lower portions of filled trenches 22 so that those portions of filled trenches 22 that are within substrate 12 become more heavily doped n-type.

Device 10 also includes a body or doped region 31 is formed in semiconductor layer 14 between and in proximity to or adjacent to, or adjoining filled trenches 22, and extends from major surface 18 of body of semiconductor material 11. In one embodiment, body regions 31 terminate laterally within buffer layer 24 and do not extend laterally into or counter-dope n-type regions 27. In one embodiment, body regions 31 comprise p-type conductivity, and have a dopant concentration suitable for forming an inversion layer that operates as conduction channels 45 of device 10. Body regions 31 extend from major surface 18 to a depth of about 1.0 to about 5.0 microns. An n-type source region 33 is formed within or in body region 31 and extends from major surface 18 to a depth of about 0.2 microns to about 0.5 microns. One or more p-type body contact regions 36 are formed in body region 31 partially within and/or below source regions 33. Body contact regions 36 are configured to provide a lower contact resistance to body region 31, and to lower the sheet resistance of body regions 31 under source regions 33, which suppresses parasitic bipolar effects.

In one embodiment, device 10 further includes n-type cap regions, channel connect, or drain extension regions 32, which are formed at an upper portion of filled trenches 22. In one embodiment, channel connect regions 32 are formed adjoining major surface 18, and have the same dopant concentration and junction depth as source regions 33, and may be conveniently formed at the same time. Channel connect regions 32 are configured to connect or electrically couple channel regions 45 to filled trenches 22. In one embodiment and as shown in FIG. 1, device 10 also includes n-type lightly doped source regions 37 adjoining, adjacent, or juxtaposed to source regions 33 and lightly doped drain regions 39 adjoining, adjacent, or juxtaposed to channel connect regions 32. By way of example, lightly doped source regions 37 and lightly doped drain regions 39 have a dopant concentration less than source regions 33 and channel connect regions 32 respectively, which will be further described in conjunction with FIGS. 2-8.

A gate dielectric layer 43 is formed over or adjoining major surface 18 adjacent to body region 31. In one embodiment, gate dielectric layer 43 comprises a silicon oxide, and has a thickness of about 0.05 microns to about 0.1 microns. In alternative embodiments, gate dielectric layer 43 comprises silicon nitride, tantalum pentoxide, titanium dioxide, barium strontium titanate, or combinations thereof including combinations with silicon oxide, or the like.

Conductive gate regions 57 are formed over gate dielectric layer 43. In one embodiment, each conductive gate region 57 is interposed between a compensation trench structure 22 and a source region 33. Conductive gate regions 57 comprise, for example, n-type polysilicon, and are about 0.3 microns to about 0.5 microns in thickness. Conductive gate regions 57 together with gate dielectric layer 43 form a control electrode or gate structures 58 for device 10. Gate structures 58 are configured to control the formation of channel 45 and the conduction of current in device 10.

An interlayer dielectric region 48 is formed over lying major surface 18, and comprises for example, a first dielectric layer 51 formed overlying conductive gate regions 57, and a second dielectric layer 61 formed overlying first dielectric layer 51 and other portions of major surface 18. By way of example, dielectric layer 51 comprises a silicon oxide, and has thickness from about 0.02 microns to about 0.05 microns. Dielectric layer 61 comprises for example, a deposited oxide, and has a thickness of about 0.4 microns to about 1.0 microns.

Openings are formed in interlayer dielectric region 48 to provide contacts to device 10 for source contact layer 63. As shown, a portion of major surface 18 is etched so that source contact layer 63 makes contact to both source regions 33 and body regions 36. In one embodiment, source contact layer 63 comprises a titanium/titanium nitride barrier layer and an aluminum silicon alloy formed overlying the barrier layer, or the like. Drain contact layer 13 is formed on an opposing surface of region of semiconductor material 11, and comprises, for example, a solderable metal structure such as titanium-nickel-silver, chrome-nickel-gold, or the like.

The operation of device 10 proceeds as follows. Assume that source terminal 63 is operating at a potential $V_S$ of zero volts, gate regions 57 receive a control voltage $V_G$=5.0 volts, which is greater than the conduction threshold of device 10, and drain terminal 13 operates at drain potential $V_D$=5.0 volts. The values of $V_G$ and $V_S$ cause body region 31 to invert under gate regions 57 to form channels 45, which electrically connect source regions 33 to channel connect regions 32. A device current ID flows from drain terminal 13 and is routed through n-type layers 26, channel connect regions 32, channels 45, source regions 33, to source terminal 63. Hence, current ID flows vertically through n-type layers 26 to produce a low on resistance. In one embodiment, $I_D$=1.0 amperes. To switch device 10 to the off state, a control voltage $V_G$ of less than the conduction threshold of device is applied to gate regions 57 (e.g., $V_G$<5.0 volts). This removes channels 45, $I_D$ no longer flows through device 10. In the off state, n-type layers 26 and p-type layers 23 compensate each other as the depletion region from the primary blocking junction spreads, which enhances BVdss.

Figure 2:
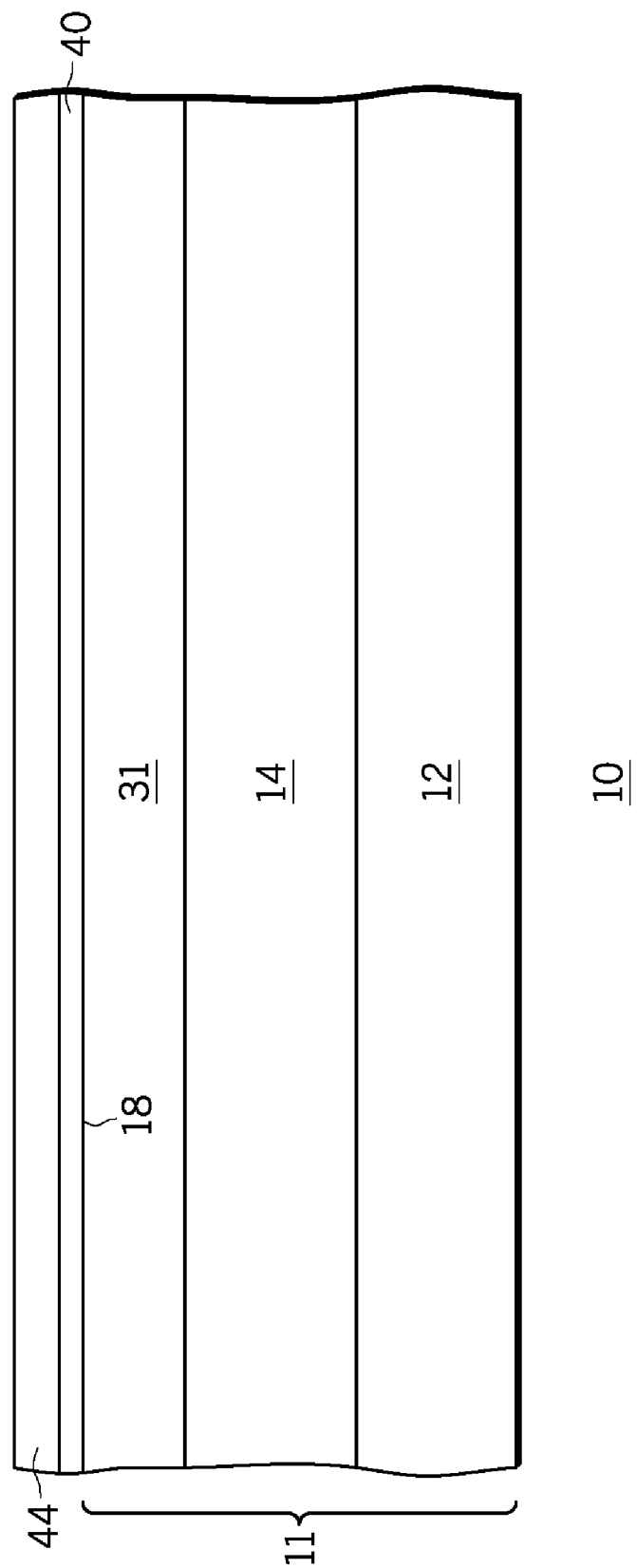
FIGS. 2-8 illustrate enlarged partial cross-sectional views of the semiconductor device of FIG. 1 at various stages of fabrication.

Turning now to FIGS. 2-9, a process for forming trench compensation structures 22 in accordance with the present invention is described. FIG. 2 shows an enlarged partial cross-sectional view of device 10 at an early stage of fabrication. An example of the material characteristics of body of semiconductor material 11 was provided in conjunction with FIG. 1 above. In an early step, a first dielectric layer 40 is formed overlying major surface 18, and comprises for example, a silicon oxide about 0.05 microns to about 0.1 microns thick. A standard photolithography step is then used to provide openings for p-type body regions 31 and edge termination structures (not shown). P-type body regions 31 are selectively formed in semiconductor layer 14 through dielectric layer 40. In an embodiment suitable for a 600 volt device, boron is implanted at a dose of about $1.0 \times 10^{13}$ atoms/cm$^2$ and an implant energy of about 160 KeV to form regions 31. A second dielectric layer 44 comprising for example a different material than first dielectric layer 40 is then formed overlying first dielectric layer 40. By way of example, second dielectric layer 44 comprises a silicon nitride when first dielectric layer 40 comprises a silicon oxide. In one embodiment, second dielectric layer 44 comprises approximately 0.2 microns of silicon nitride, and is formed using conventional deposition techniques. Next, the implanted p-type dopant is heat treated to diffuse the dopant to a desired depth to form regions 31. By way of example, body regions 31 have a depth of about 3.0 to about 5.0 microns.

Figure 3:
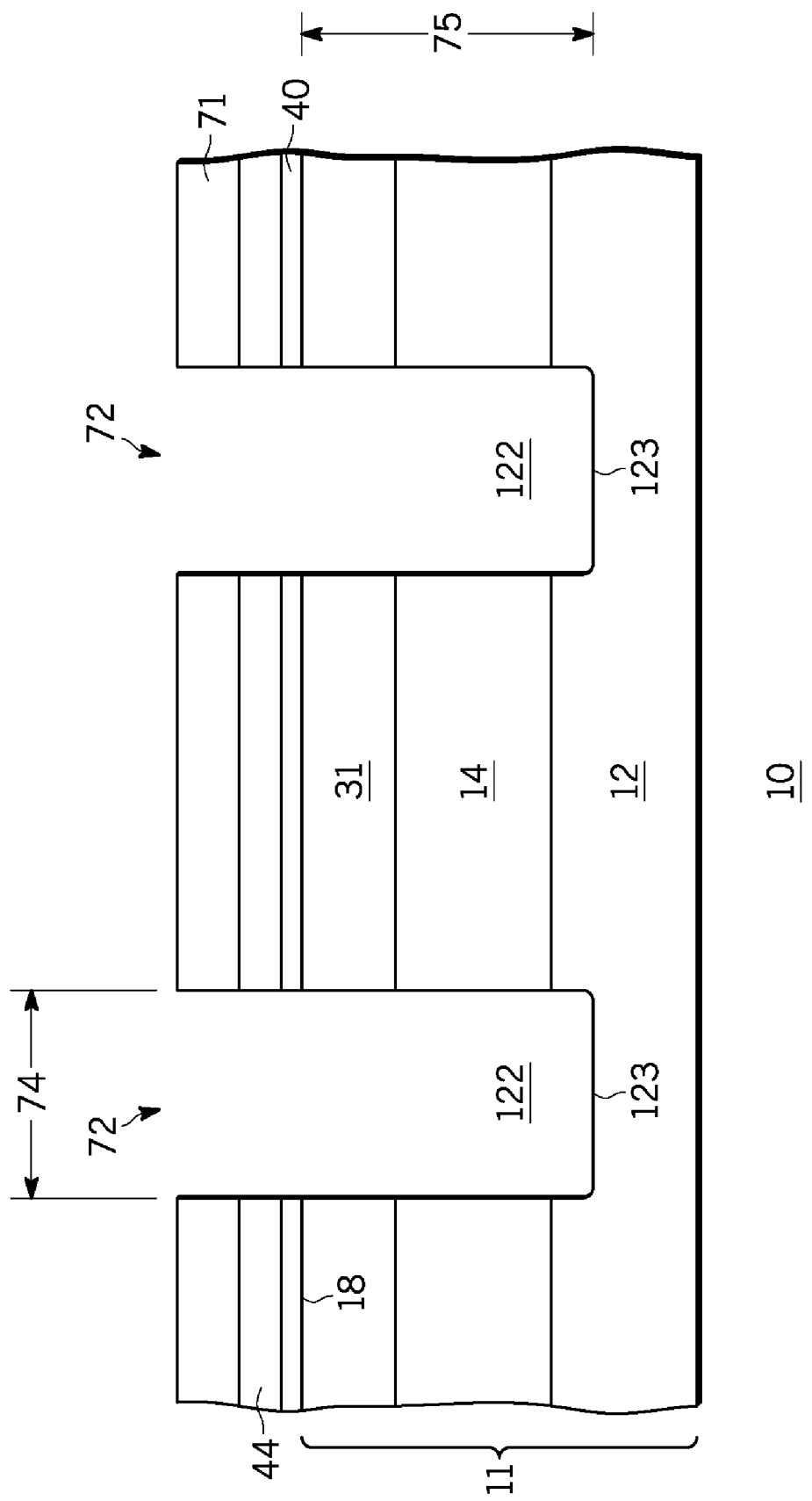

FIG. 3 shows an enlarged partial cross-sectional view of device 10 at a subsequent stage of fabrication. Hard mask layer 71 is formed overlying major surface 18 and patterned to form openings 72 through hard mask layer 71, second dielectric layer 44, and first dielectric layer 40 to expose portions of major surface 18. By way of example, hard mask layer 71 comprises about 1.0 microns of deposited oxide. By way of example, openings 72 have a width 74 on the order of about 3.0 microns to about 5.0 microns.

Next, trenches 122 are formed through semiconductor layer 14. In one embodiment, trenches 122 extend into at least a portion of substrate 12. The depth of trenches 122 is determined by the thickness of semiconductor layer 14, which is a function of BVdss. The method of the present invention is suitable for high aspect ratio trenches from about 10:1 (depth to width) to about 30:1. However, the method is suitable for lower aspect ratios as well. In one embodiment, trenches 122 have a depth 75 up to about 50 to 60 microns. In one embodiment, Deep Reactive Ion Etching (DRIE) etching with a fluorine or chlorine based chemistry is used to form trenches 122. Several techniques are available for DRIE etching including cryogenic, high density plasma, or Bosch DRIE processing. In one embodiment, trenches 122 have substantially vertical sidewalls.

In an alternative embodiment, trenches 122 have a tapered profile where the width of the trench at the trench lower surface is less than width 74. In one embodiment, trenches 122 have a wall slope between about 0.5 degrees and about 1.0 degree, and a substantially flat bottom or lower surface 123. It was found that the slight taper helps in the epitaxial growth process as does substantially flat lower surface 123 compared to trenches with more round lower surfaces. In particular, trenches with rounded or curved lower surfaces can lead to inhomogeneous epitaxial filling as a result of preferential growth on low index planes of silicon such as the {110}, {111}, and {100} planes.

Although trenches 122 are stated as plural, it is understood that trenches 122 may be a single continuous trench or connected trench matrix. Alternatively, trenches 122 may be a plurality of individual trenches with closed ends and separated by portions of body of semiconductor material 11.

Figure 4:
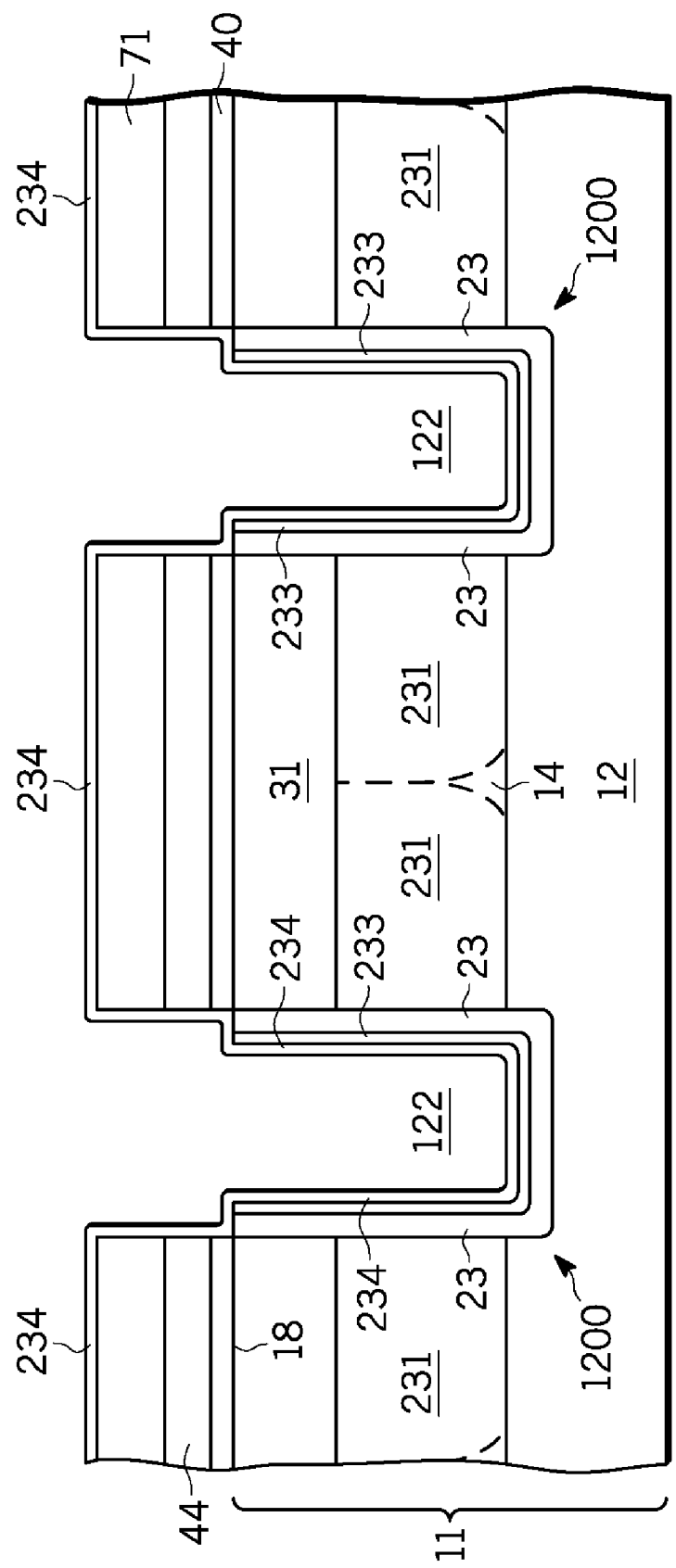

FIG. 4 shows an enlarged partial cross-sectional view of device 10 at a further stage of processing. At this point, layers of semiconductor material are formed, grown, or deposited in trenches 122 as a first stage in forming filled trenches 22. In one embodiment, single crystal semiconductor epitaxial growth techniques are used to fill or partially fill trenches 122. That is, single crystal or monocrystalline semiconductor layers are grown within trenches 122. Monocrystalline semiconductor layers are preferred over polycrystalline layer because polycrystalline layers result in higher leakage currents, which detrimentally affect device performance.

In a first step, body of semiconductor material 11 is subjected to a conventional pre-diffusion clean, and then a thin thermal oxide (not shown) is formed on the sidewalls and lower surfaces of trenches 122 to remove any surface damage (e.g., scalloping) caused by the DRIE step. The thin thermal oxide is then removed using conventional isotropic etching techniques (e.g., 10:1 wet oxide strip). Next, body of semiconductor material 11 is placed into an epitaxial growth reactor and pre-cleaned as a first step of the epitaxial growth process. By way of example, an ASM E2000 epitaxial reactor is used. In conventional epitaxial growth processes, pre-clean steps are done at temperatures from 1150 degrees Celsius to 1200 degrees Celsius for times typically in excess of 10 minutes. However, it was found that this conventional pre-clean temperature range causes undercutting to occur at the interface of surface 18 and dielectric layer 40, which detrimentally impacts the subsequent growth of the epitaxial layers and the resultant structure. It is believed that this effect resulted from the migration of semiconductor atoms (e.g., silicon) caused by interfacial stresses. The undercutting and migration effect creates bulges in these regions and further results in excessive polycrystalline growth at the top portions of the structures during subsequent epitaxial growth processing. These problems in turn inhibit the effectiveness of subsequent wafer processing and impact the quality and reliability of the resultant device.

In one embodiment, body of semiconductor material 11 is pre-cleaned at a temperature less than about 1150 degrees Celsius in hydrogen. In one embodiment, a sixty second pre-clean is used at a temperature from about 1040 to about 1060 degrees Celsius in hydrogen under a reduced pressure of less than about 540 kgf/m$^2$ (less than about 40 Torr). In another embodiment, a reduce pressure between about 270 kfg/m$^2$ and about 540 kgf/m$^2$ (between about 20 Torr and about 40 Torr) is used. This in-situ desorption pre-clean step was found to minimize interfacial undercutting and to help ensure a very clean surface (e.g., free of traces of oxides and contaminants) along trenches 122, which is desired for single crystal epitaxial growth.

The following description illustrates a selective epitaxial growth process for forming layer 23 and a first intrinsic layer 233 in accordance with the present invention. Following the pre-clean step described above, p-type layer 23 is grown overlying surfaces of trenches 122. In one embodiment, a dichlorosilane source gas is used to form p-type layer 23 with a growth temperature in a range from about 1050±50 degrees Celsius in a reduced pressure ambient less than about 540 kg/m$^2$ (less than about 40 Torr).

In one embodiment, the following flow conditions were used to selectively form p-type layer 23 in an isothermal process: about 40 standard liters (slm) of hydrogen and about 250 to about 500 cubic centimeters (cc) of dichlorosilane. In one embodiment, a flow rate of HCl of about 1.5 to about 3 times that of the dichlorosilane is used. A suitable boron dopant source (e.g., diborane) is used so that p-type layer 23 has a dopant concentration on the order of about $3.0 \times 10^{16}$ to about $9.0 \times 10^{16}$ atoms/cm$^3$, and a thickness of about 0.1 microns to about 0.3 microns.

Next, the boron dopant source is turned-off, the reactor chamber purged, and first intrinsic layer 233 is formed overlying p-type layer 23. In one embodiment, intrinsic layer 233 has a thickness of about 0.1 to about 0.2 microns. A capping layer 234 is then formed overlying layer 233, and comprises for example, about 0.05 microns of thermal oxide and about 0.1 microns of nitride. Next, device 10 is heated primarily to laterally diffuse p-type dopant from layer 23 into semiconductor layer 14 to form laterally diffused p-type regions 231. In one embodiment, an anneal step of about 2 hours at about 1100 degrees Celsius is used for this step with adjustments made to achieve the desired movement of dopant into layer 14.

Layer 234 is configured to cap p-type layer 23 and intrinsic layer 233 during the heat treatment step to prevent dopant from out-diffusing from layer 23. Also, during the heat treatment step, n-type dopant from substrate 12 diffuses into portions 1200 of layer 23 converting portions 1200 to n-type. Further, p-type dopant in layer 23 diffuses into intrinsic layer 233 converting intrinsic layer 233 into p-type layer 23, which is shown as a continuous layer 23 in FIGS. 5-9. After the heat treatment step, capping layer 234 is removed using conventional etching techniques.

Figure 5:
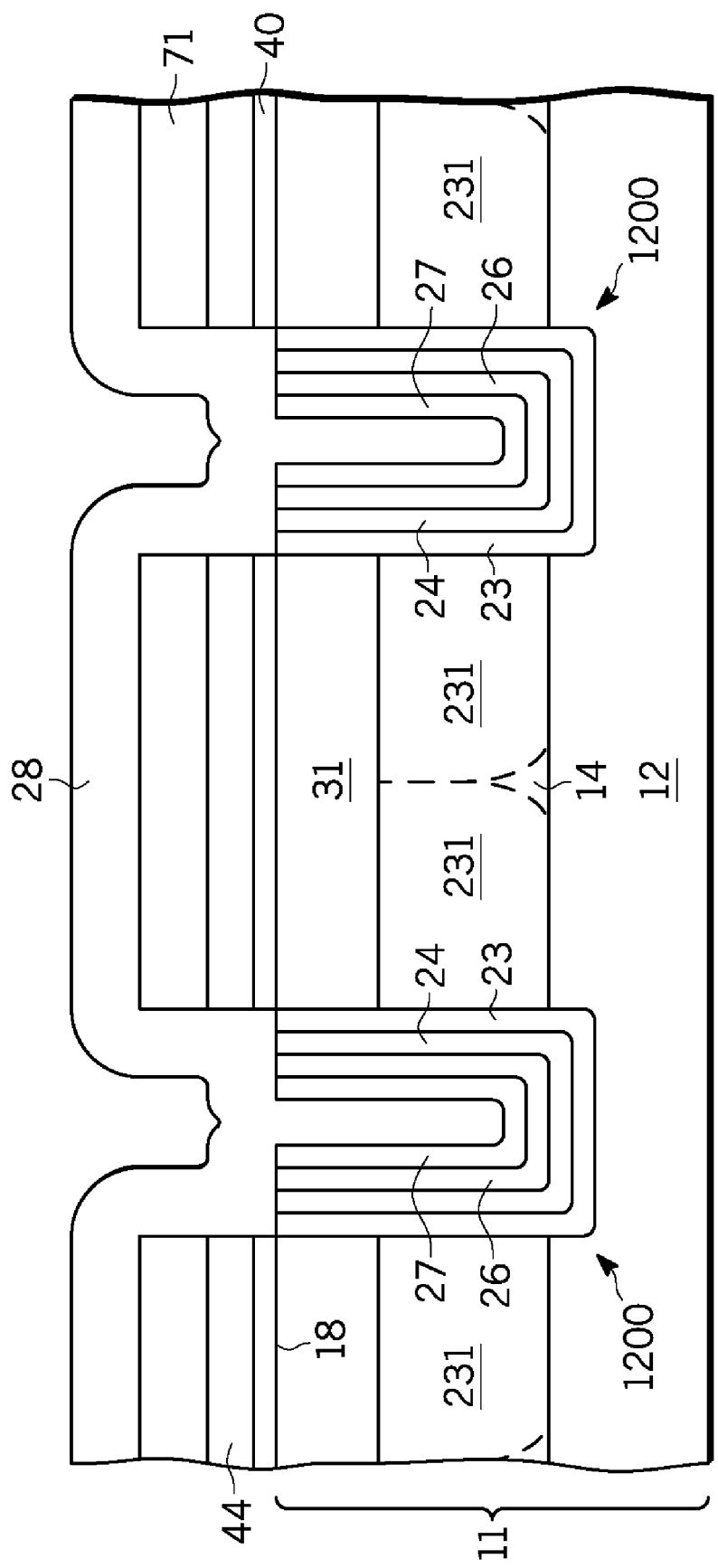

Turning now to FIG. 5, intrinsic or buffer layer 24 is grown overlying p-type layer 23, and is either undoped, or is very lightly doped p-type with a dopant concentration of less than about $2.0 \times 10^{14}$ atoms/cm$^3$. Layer 24 has a thickness of about 0.5 microns to about 1.5 microns. In one embodiment, the following flow conditions were used to selectively form layer intrinsic layer 24 in an isothermal process: about 40 liters (slm) of hydrogen and about 250 to about 500 cubic centimeters (cc) of dichlorosilane. In one embodiment, a flow rate of HCl of about 1.5 to about 3 times that of the dichlorosilane is used.

N-type layer 26 is then selectively grown overlying layer 24 using the same growth conditions as set forth for layer 24 except with an n-type dopant such as phosphorous, arsenic or antimony is added. In one embodiment, n-type layer 26 has a dopant concentration on the order of about $1.5 \times 10^{16}$ to about $4.5 \times 10^{16}$ atoms/cm$^3$, and a thickness of about 0.2 microns to about 0.4 microns. In one embodiment, a purge cycle is used after n-type layer 26 is grown and before intrinsic layer 27 is grown. It was found that the purging of dopant gas or gases after n-type layer 26 is formed provides n-type layer 26 with a more abrupt dopant profile, which enhances the charge compensation effects of device 10. By way of example, a purge cycle of 30 to 60 seconds is sufficient in high flow hydrogen. However, too long of a purge results in dopant out-diffusion from layer 26.

Intrinsic or buffer layer 27 is then grown over n-type layer 26. In one embodiment, growth conditions similar to those used for layers 23, 24 and 26 are used to form layer 27. Next, a thin wet oxide is grown over layer 27 followed by the formation of dielectric layer 28, which comprises for example a deposited oxide having a thickness suitable to fill trenches 122. In one embodiment, multiple steps are used to form dielectric layer 28, with etch-back or planarization steps done in between deposition steps to ensure that trenches 122 are filled to a desired level. It should be understood that the thicknesses of layers 23, 24, 26, 27, and 28 are adjusted depending on the width of trenches 122.

Figure 6:
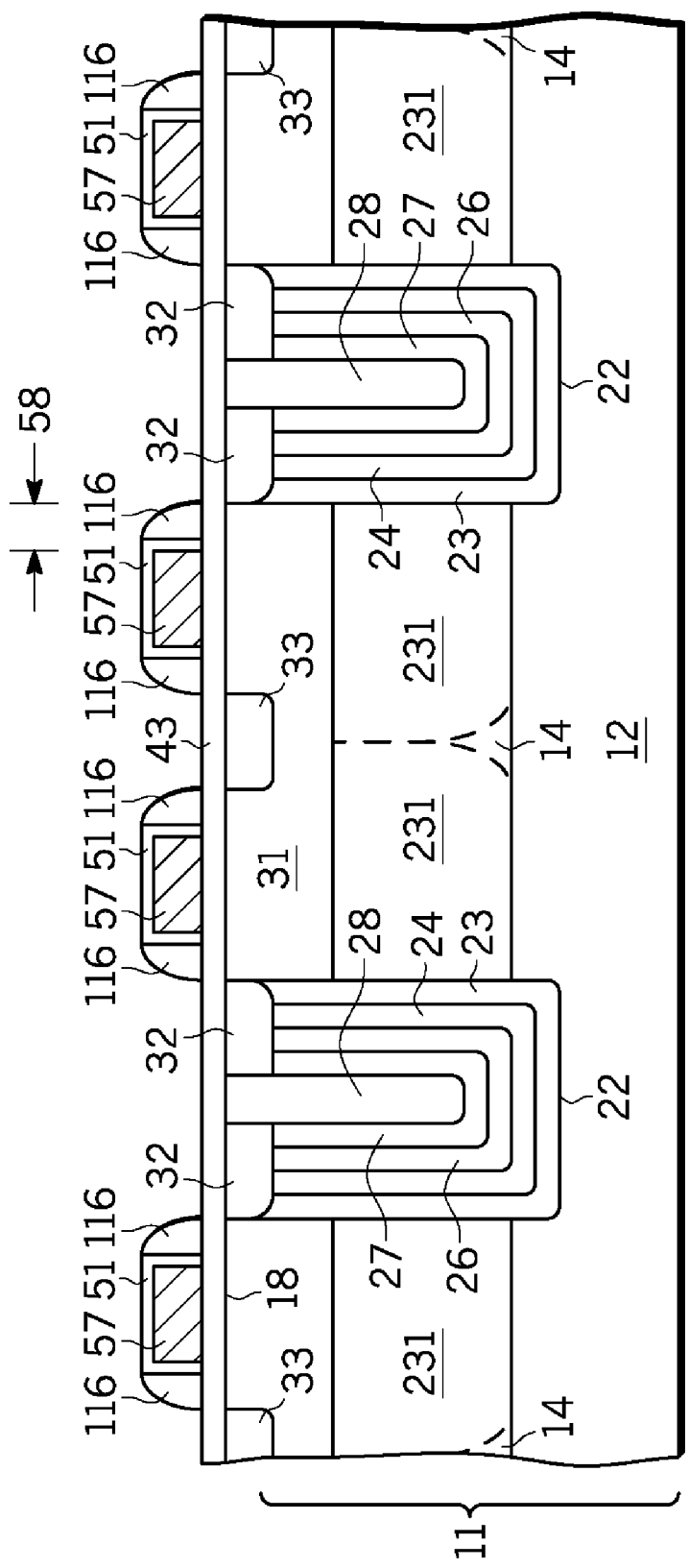

FIG. 6 shows an enlarged partial cross-sectional view of device 10 at a still further stage of fabrication after layer 28 is planarized down to, back to, or in proximity with major surface 18 to form filled trenches 22. By way of example, etch back or chemical mechanical planarization techniques are used to planarize these layers. In one embodiment, a polysilicon layer and a photoresist layer are formed overlying dielectric layer 28, and the layers are then etched back or planarized using second dielectric layer 44 as a stop layer. Layers 44 and 40 are then removed using conventional techniques.

Next, gate dielectric layer 43 is formed overlying major surface 18. In one embodiment, gate dielectric layer 43 comprises silicon oxide, and has a thickness of about 0.05 microns to about 0.1 microns. A conductive layer such as a doped or undoped polysilicon layer is deposited overlying gate dielectric layer 43 and patterned to form gate conductive regions 57. For example, gate conductive regions 57 comprise about 0.2 microns of doped or undoped polysilicon. If gate conductive regions are initially undoped, these regions as subsequently doped during the formation of regions 32 and 33. Note that in one embodiment, gate conductive regions 57 are spaced apart (i.e., do not overlap) a distance 58 from filled trenches 22 to allow for spacer techniques to be used in form regions 32, 33, 37 and 39 in accordance with the present invention.

A passivation layer is then formed overlying major surface 18 and patterned to form first dielectric layer 51. By way of example, first dielectric layer 51 comprising about 0.02 to about 0.1 microns of oxide. A spacer layer is then formed overlying major surface 18 and etched to form spacers 116. By way of example, spacers 116 comprise about 0.2 microns of polysilicon. It is understood that the thickness of spacer 116 is adjusted depending on the desired lateral width of regions 37 and 39. Channel connect regions 32 and source regions 33 are then formed self-aligned to spacers 116. By way of example, a phosphorous implant dose of $3.0 \times 10^{15}$ atoms/cm$^2$ with an implant energy of 80 KeV is used for this doping step. The implanted dopant is either annealed and diffused at this step, or is annealed after the formation of the other doped regions described below.

Figure 7:
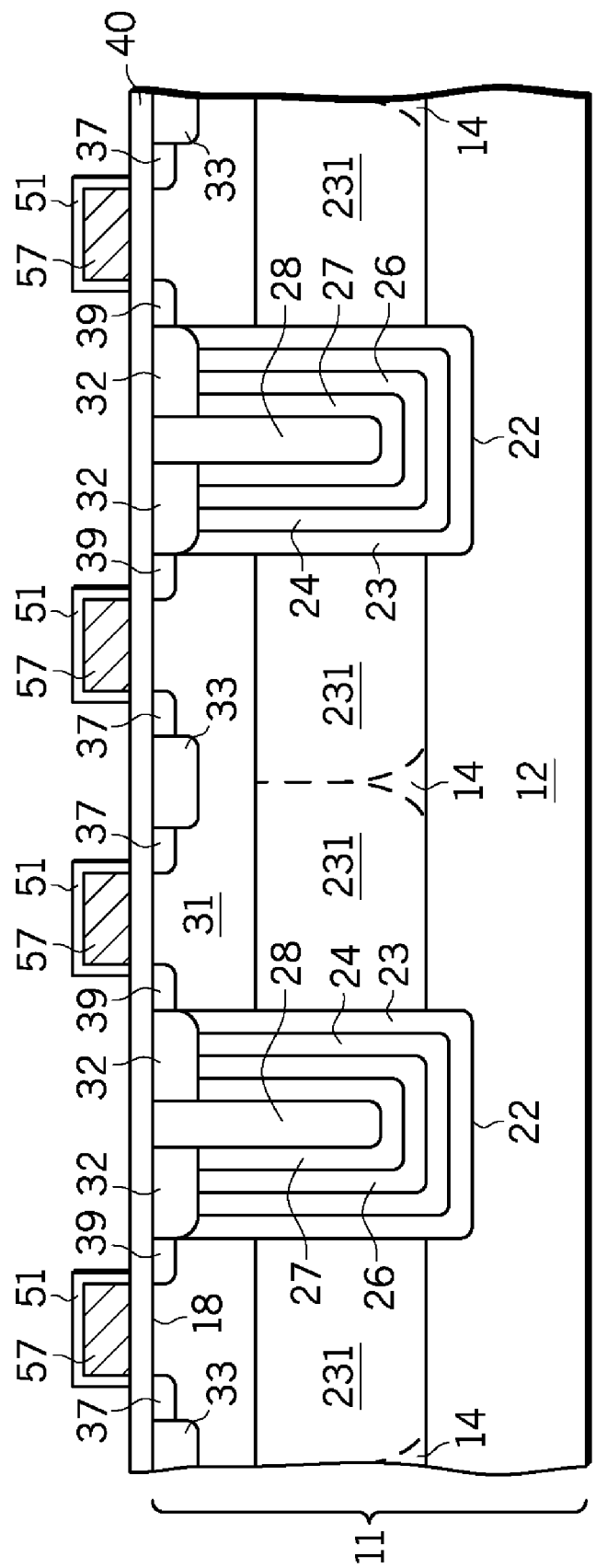

FIG. 7 shows an enlarged partial cross-sectional view of device 10 at another stage of fabrication. Spacers 116 are removed, and lightly doped source regions 37 and lightly doped drain regions 39 are then formed adjacent source regions 33 and channel connect regions 32 respectively. By way of example, a phosphorous implant dose of about $1.0 \times 10^{14}$ to about $3.0 \times 10^{14}$ atoms/cm$^2$ with an implant energy of 60 KeV is used for this doping step.

Figure 8:
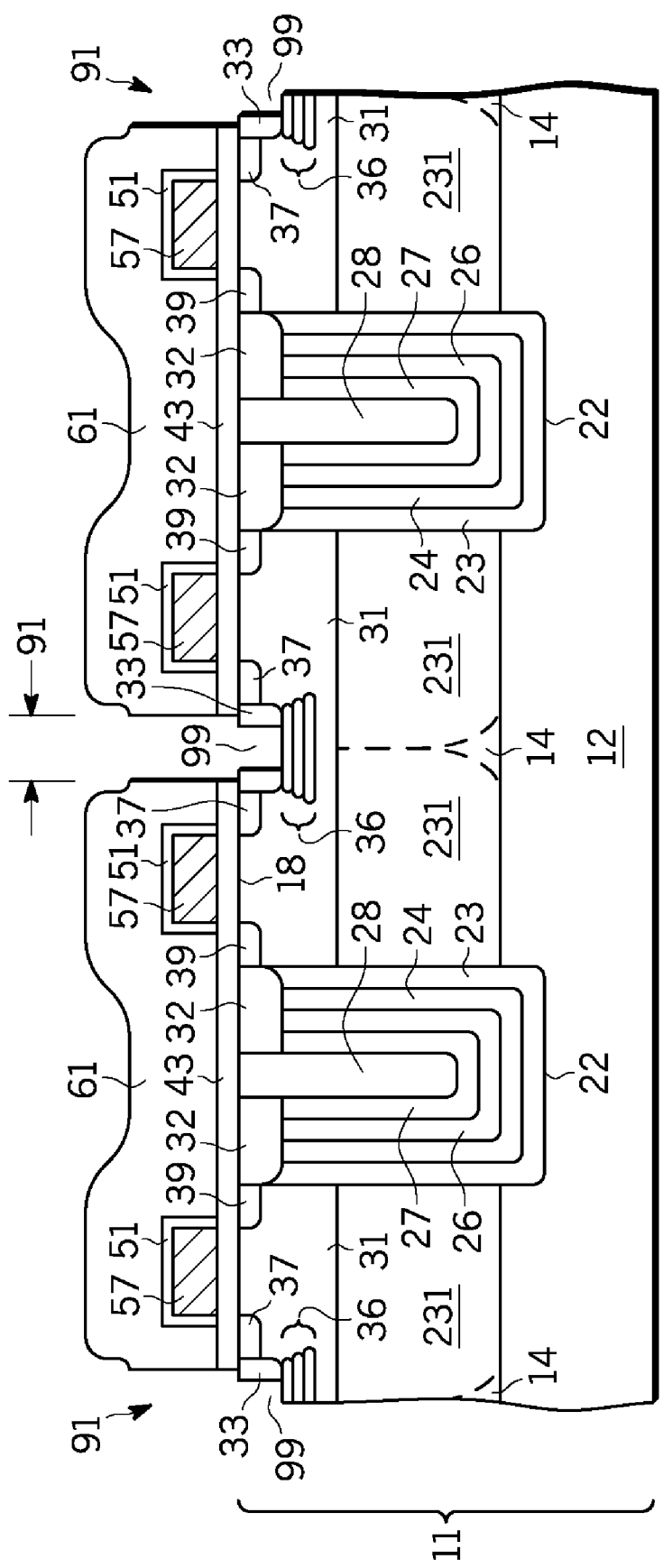
Figure 9:
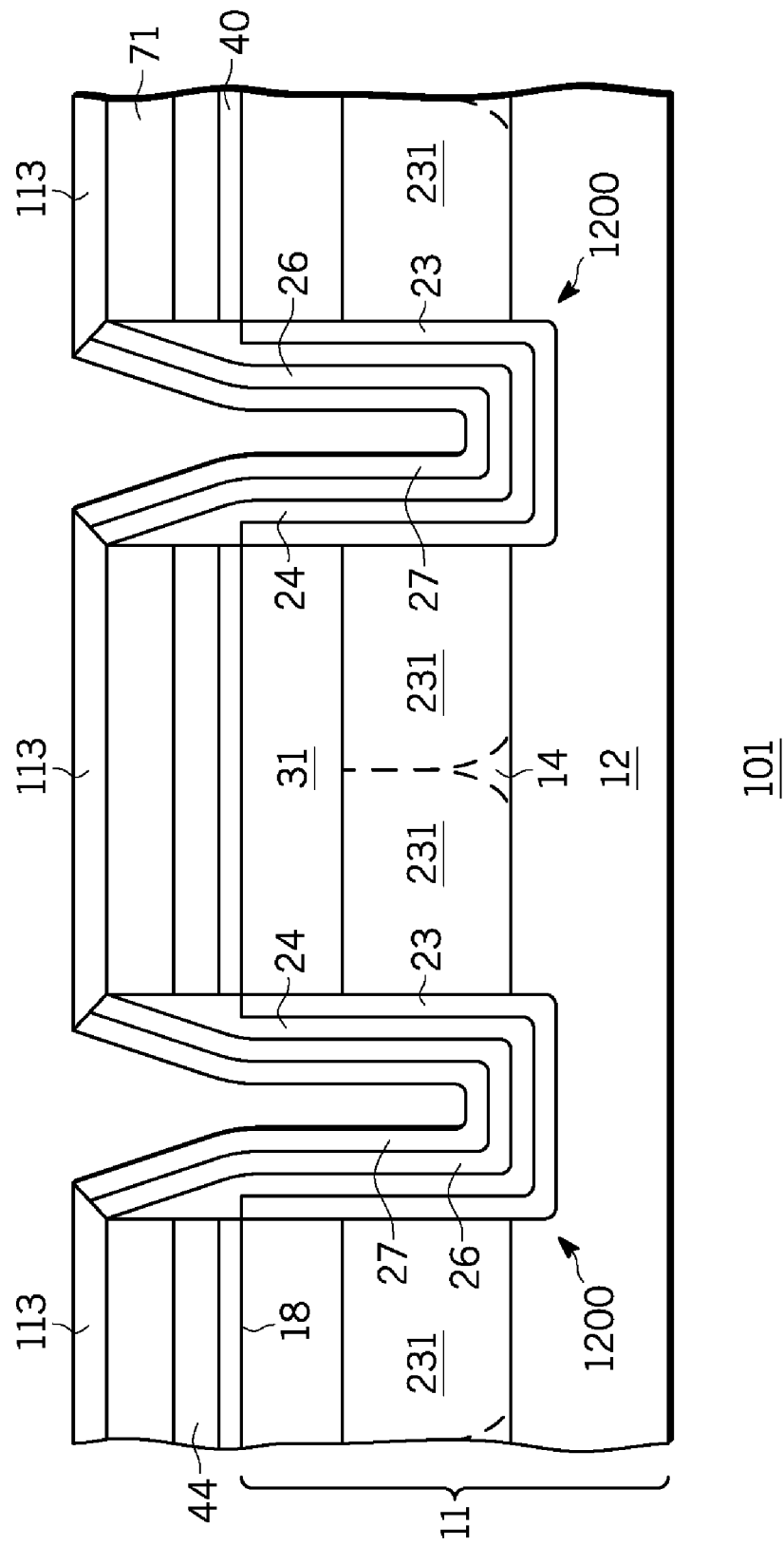
FIG. 9 illustrates a highly enlarged partial cross-sectional view of a portion of a semiconductor device according to another embodiment of the present invention.

FIG. 8 shows an enlarged partial cross-sectional view of device 10 after additional processing. Passivation or dielectric layer 61 is formed overlying major surface 18. By way of example, layer 61 comprises a deposited oxide and has a thickness from about 0.5 microns to about 1.0 microns. A contact photolithography step is used to form openings 91, to expose portions of major surface 18 above source regions 33. Next an optional conformal spacer layer is formed overlying major surface 18 and etched to form spacers (not shown) on the sidewalls of layer 61 within openings 91. An optional isotropic etch is used to widen openings 91 near the outer surface of layer 61 as shown in FIG. 9. Major surface 18 is then exposed to an etchant that removes material from semiconductor layer 14 to form recessed regions 99. Next, body contact regions 36 are formed through openings 91 and recessed regions 99. In one embodiment, a series of implants or a chain of implants are used so that body contact regions 36 comprise a plurality of regions as shown in FIG. 9. In one embodiment, three boron implants are used with increasing implant energies to provide the tapered shape shown in FIG. 9. That is, a higher ion implant energy provides a deeper and wider region while a lower ion implant energy provides a shallower and narrower region. By way of example, a first implant of boron at dose from about $1.0 \times 10^{14}$ atoms/cm$^2$ to about $1.0 \times 10^{15}$ atoms/cm$^2$ and an energy of about 200 KeV is used, then a second implant of boron at about $1.0 \times 10^{14}$ atoms/cm$^2$ to about $1.0 \times 10^{15}$ atoms/cm$^2$ and an energy of about 100 KeV is used, and then a third implant of boron at about $1.0 \times 10^{14}$ atoms/cm$^2$ to about $1.0 \times 10^{15}$ atoms/cm$^2$ and an energy of 25-30 KeV is used to form region 36. In alternative method, body contact regions 36 are formed prior to the formation of dielectric layer 61 using conventional masking techniques. Dielectric layer 61 is then formed and patterned thereafter.

After body contact region 36 is formed, the spacers are removed from openings 91, and source contact or conductive layer 63 is formed overlying major surface 18. By way of example, a barrier structure is formed such as titanium/titanium nitride followed by a layer comprising aluminum or an aluminum alloy. The conductive layers are then patterned using conventional photolithographic and etch techniques to form source contact layer 63 as shown in FIG. 1. In one embodiment, a final passivation layer is used overlying source contact layer 63, and comprises a deposited oxide, a deposited nitride or combinations thereof. Device 10 is then thinned, and drain contact layer 13 is formed contacting substrate 12 as shown in and further described in conjunction with FIG. 1.

FIG. 9 shows an enlarged partial cross-sectional view of a charge compensation trench structure device 101 in accordance with an alternative embodiment at an intermediate step in fabrication. Device 101 is similar to device 10, except in device 101 a modified epitaxial growth process is used when growing layers 24, 26, and/or 27. For example, during the growth of one or more of these layers, non-selective epitaxial growth is used to form a polycrystalline semiconductor layer or layers 113 overlying dielectric layers 71, 44 and 40. By way of example, polycrystalline semiconductor layer 113 comprises a polysilicon layer, and is used to provide conductive or resistive structures for other features of device 101 such as gate feeds, resistors, capacitive plates, or the like. Depending on the desired thickness, layer 113 is formed during the appropriate growth step (i.e., during the growth of layer 24, 26, and/or 27). That is, if a thicker polycrystalline layer is desired, layer 113 is formed with layer 24. If a thinner layer is desired, layer 113 is formed with layer 26 or 27.

By way of example, layer 113 is formed during the formation of layers 24, 26, and/or 27 using the following the following growth conditions. First a non-selective thin epitaxial layer is grown using a silane source gas, which forms a polycrystalline seed layer overlying the dielectric material and a single crystal layer on the exposed single crystal semiconductor material within trenches 1200. In one embodiment, HCl is not used with the silane source gas. Next, a dichlorosilane source gas is used to form the remaining monocrystalline semiconductor layer(s) within the trench regions using the process conditions as described in conjunction with FIGS. 4 and 5. During this step, the thickness of polycrystalline layer 113 increases as well.

The method of the present invention provides very reproducible single crystal epitaxial growth with a low variation in thickness less ±5% across a wafer, a charge balance control of about 4-5%, and charge targeting accuracy within about 1-2%. These features are key in producing cost effective charge compensation devices.

In summary, a method of manufacturing a semiconductor device having deep trench charge compensation structures has been described. The method includes forming trenches in a body of semiconductor material, and then growing or depositing multiple monocrystalline semiconductor layers within the trenches. A reduced temperature hydrogen clean step is used prior to the growth of the first monocrystalline semiconductor layer to reduce an undercutting effect and improve growth characteristics of the structure. A short purge step is used after forming one of the doped monocrystalline semiconductor layers to improve control of the layer's dopant profile. In one embodiment, a mixture of source gases is used to selectively and non-selectively form portions of the trench structure.

Although the invention has been described and illustrated with reference to specific embodiments thereof, it is not intended that the invention be limited to these illustrative embodiments. For example, the method may be used to form other semiconductor comprising silicon/carbon, silicon/germanium, silicon/carbon/germanium, gallium arsenide, indium phosphide, and other materials. Those skilled in the art will recognize that modifications and variations can be made without departing from the spirit of the invention. Therefore, it is intended that this invention encompass all such variations and modifications as fall within the scope of the appended claims.

We claim:

1. A method of forming a semiconductor device comprising the steps of:
   providing a region of semiconductor material having a first major surface, a dielectric region overlying the first major surface, and a trench formed in the region of semiconductor material, wherein the region of the semiconductor material is comprised of a first semiconductor region of a first conductivity type and a second semiconductor region of a second conductivity which is the opposite of the first conductivity type;
   exposing surfaces of the trench to hydrogen at a temperature in range from about 1000 degrees Celsius to less than about 1100 degrees Celsius; and
   forming a plurality of monocrystalline semiconductor layers overlying the surfaces of the trench after the step of exposing the surfaces of the trench.

2. The method of claim 1, wherein the exposing step comprises exposing the surfaces at a reduced pressure less than about 540 kgf/m².

3. The method of claim 1, wherein the exposing step comprises exposing the surfaces for a time less than about sixty seconds.

4. The method of claim 1, wherein the step of forming the plurality of monocrystalline semiconductor layers comprises selectively forming at least one monocrystalline semiconductor layer using a dichlorosilane source gas.

5. The method of claim 4, wherein the step of forming the at least one monocrystalline semiconductor layer further includes forming the at least one monocrystalline semiconductor layer using HCl, wherein the ratio of HCl to dichlorosilane is about 1.5 to about 3.0.

6. The method of claim 4, wherein the step of forming the at least one monocrystalline semiconductor layer includes forming the at least one monocrystalline semiconductor layer at a temperature from about 1040 degrees Celsius to about 1060 degrees Celsius and at a pressure less than about 540 kgf/m².

7. The method of claim 1, wherein the step of providing the region of semiconductor material includes the steps of:
   providing a region of semiconductor material having the first major surface;
   forming the dielectric layer overlying the first major surface;
   forming an opening in the dielectric layer; and
   etching the trench into the region of semiconductor material through the opening using deep reactive ion etching.

8. The method of claim 7, wherein the step of etching the trench includes etching a trench having a tapered profile, wherein the trench is wider in proximity to the first major surface.

9. The method of claim 8, wherein the step of etching the trench includes etching a trench having a wall slope between about 0.5 degrees and about 1.0 degree.

10. The method of claim 1, wherein the step of providing the region of semiconductor material includes providing a region of semiconductor material having a trench formed in the region of semiconductor material with an aspect ratio from about 10:1 (depth to width) to about 30:1.

11. The method of claim 1, wherein the step forming the plurality of monocrystalline semiconductor layers includes forming a trench charge compensation region.

12. The method of claim 11 further comprising the steps of:
   forming a body region in the region of semiconductor material near the first major surface;
   forming a source region in the body region and laterally spaced apart from the trench charge compensation structure;
   forming a gate structure between the source region and trench charge compensation structure, wherein the gate structure includes a conductive gate region configured to establish a channel region in the body region when the device is in operation; and
   forming a channel connecting region formed at an upper portion of the trench charge compensation structure configured to electrically connect the channel region to the trench charge compensation region when the device is in operation.

13. The method of claim 12 wherein the step of forming the body region includes forming a body region, wherein the body region and the first semiconductor material of the region of semiconductor material comprise opposite conductivity types.

14. The method of claim 1 wherein step of forming the plurality of monocrystalline semiconductor layers includes the steps of:
   selectively forming a first monocrystalline semiconductor layer of the second conductivity type overlying sidewalls and a lower surface of the trench;
   forming a first buffer layer overlying the first monocrystalline semiconductor layer; and
   forming a second monocrystalline semiconductor layer of the first conductivity type formed overlying the first buffer layer.

15. The method of claim 14 further comprising the step of forming a second buffer layer overlying the first buffer layer before the step of forming the second monocrystalline semiconductor layer.

16. The method of claim 15, wherein the step of forming the second buffer layer includes non-selectively forming the second buffer layer so that a portion of the second buffer layer comprises monocrystalline semiconductor material within the trench, and a second portion comprises polycrystalline semiconductor material overlying the dielectric layer.

17. A method for forming a semiconductor device comprising the steps of:
   providing a region of semiconductor material having a first major surface, a dielectric region overlying the first major surface, and a trench formed in the region of semiconductor material, wherein the region of the semiconductor material is comprised of a first semiconductor region of a first conductivity type and a second semiconductor region of a second conductivity type, which is the opposite of the first conductivity type;

exposing surfaces of the trench to hydrogen at a temperature less than about 1100 degrees Celsius under reduced pressure; and forming a plurality of monocrystalline semiconductor layers overlying the surfaces of the trench after the step of exposing the surfaces of the trench, wherein at least two layers comprise opposite conductivity types.

18. The method of claim 17, wherein the step forming the plurality of monocrystalline semiconductor layers includes selectively forming at least one of the at least two layers.

19. A process for forming a semiconductor device having a trench charge compensation region comprising the steps of:

providing a body of semiconductor material having a first major surface;

forming a trench in the body of semiconductor material extending from the first major surface, wherein the trench has an aspect ratio n from 10:1 (depth to width) to about 30:1;

exposing surfaces of the trench to a temperature less than about 1100 degrees Celsius under reduced pressure in the presence of hydrogen;

forming a single crystal semiconductor layer overlying the surfaces of the trench, wherein the first single crystal semiconductor layer has a first conductivity type;

forming a first buffer layer overlying the first single crystal semiconductor layer, wherein the first buffer layer has a dopant concentration at least one order of magnitude less than that of the first single crystal semiconductor layer;

exposing the body of semiconductor material to an elevated temperature to redistribute dopant from the first semiconductor layer into the body of semiconductor material;

forming a second buffer layer overlying the first buffer layer; and forming a second single crystal semiconductor layer overlying the second buffer layer, wherein the second single crystal semiconductor layer comprises a second conductivity type opposite the first conductivity type.

20. The process of claim 19, further comprising the steps of:

forming a third buffer layer overlying the second single crystal semiconductor layer; and forming a dielectric layer overlying the third buffer layer.

21. The method of claim 19, wherein the step of exposing the surfaces includes exposing the surfaces to a temperature from about 1000 degrees Celsius to about 1100 Celsius for a time less than about sixty seconds and a pressure less than about 540 kgf/m$^2$.

* * * * *